US007583719B2

(12) United States Patent
Makino

(10) Patent No.: US 7,583,719 B2
(45) Date of Patent: Sep. 1, 2009

(54) COMPLEX-COUPLED DISTRIBUTED FEEDBACK SEMICONDUCTOR LASER

(75) Inventor: Toshihiko Makino, Irvine, CA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 461 days.

(21) Appl. No.: 11/280,517

(22) Filed: Aug. 24, 2005

(65) Prior Publication Data
US 2007/0053404 A1 Mar. 8, 2007

(51) Int. Cl.
*H01S 3/08* (2006.01)

(52) U.S. Cl. ............... 372/102; 372/43.01; 372/44.01; 372/50.11; 372/96; 372/98

(58) Field of Classification Search ............ 372/96, 372/43.01, 44.01, 50.11, 98, 102
See application file for complete search history.

(56) References Cited

U.S. PATENT DOCUMENTS

| 5,164,956 | A | 11/1992 | Lang |
| 5,208,824 | A * | 5/1993 | Tsang .................. 372/96 |
| 5,452,318 | A | 9/1995 | Makino et al. |
| 6,104,739 | A * | 8/2000 | Hong et al. ............ 372/50.11 |
| 6,330,265 | B1 | 12/2001 | Kinoshita |
| 6,608,855 | B1 | 8/2003 | Hwang et al. |
| 7,180,930 | B2 | 2/2007 | Takaki et al. |
| 2007/0053404 | A1 | 3/2007 | Makino |

OTHER PUBLICATIONS

Henry, "Observation of Destructive Interference in the Radiation Loss of Second-Order Distributed Feedback Lasers," IEEE Journal of Quantum Electronics, vol. QE-21, No. 2, Feb. 1985, pp. 151-154.

Kazarinov, et al., "Second-Order Distributed Feedback Lasers with Mode Selection Provided by First-Order Radiation Losses," IEEE Journal of Quantum Electronics, vol. QE-21, No. 2, Feb. 1985, pp. 144-150.

Hong, et al., "Matrix-Grating Strongly Gain-Coupled (MG-SGC) DFB Lasers with 34-nm Continuous Wavelength Tuning Range," IEEE Photonics Technology Letters, vol. 11, No. 5, May 1999, pp. 515-517.

(Continued)

*Primary Examiner*—Minsun Harvey
*Assistant Examiner*—Yuanda Zhang
(74) *Attorney, Agent, or Firm*—Norman Stephan Kinsella; Grossman, Tucker, Perrault & Pfleger LLC

(57) ABSTRACT

A distributed feedback semiconductor laser may have (1) a controlled complex-coupling coefficient which is not affected by grating etching depth variation, and (2) facet power asymmetry with no facet reflection which eliminates a random effect of facet grating phase. The device comprises a multiple-quantum-well active region, and a complex-coupled grating formed by periodically etching grooves through a part of the active region. The semiconductor materials for a barrier layer where the groove etching is to be stopped, a regrown layer in the etched groove, and a laser cladding layer, are chosen all the same, so as to form an active grating entirely buried in the same material, providing a complex-coupling coefficient which is defined independently of the etching depth. Facet power symmetry may also be provided by composing the laser cavity of two sections ("front" and "back" sections) having different ("front" and "back") Bragg wavelengths.

15 Claims, 8 Drawing Sheets

OTHER PUBLICATIONS

Hong, et al., "Strongly Gain-Coupled (SGC) Coolerless (−40°C. ~ +85°C.) MQW DFB Lasers," IEEE Journal of Selected Topics in Quantum Electronics, vol. 5, No. 3, May/Jun. 1999, pp. 442-448.

Woods, "Transmission over 560 km at 2.5 Gb/s using a directly modulated buried heterostructure gain-coupled DFB semiconductor laser," Thursday Morning, OFC 2002, pp. 422-423.

Booknam Data Sheet, "2.5 Gb/s Buried Het Laser 360km Extended Reach With Optional Etalon Stabilization LC25W-B (360km)," available at http://www.bookham.com/documents/datasheets_tnl/LC25W-B_14Feb07.pdf.

Kogelnik, et al., "Coupled-mode theory of distributed feedback lasers," Journal of Applied Physics, vol. 43, No. 5, pp. 2327-2335, May 1972.

Utaka, et al., "η4-shifted inGaAsP/InPDFB lasers", IEEE Journal of Quantum Electronics, vol. QE-22, No. 7, pp. 1042-1052, Jul. 1986.

Kapon, et al. "The effect of complex coupling coefficients on distributed feedback lasers," IEEE Journal of Quantum Electronics, vol. QE-19, pp. 66-71, Jan 1982.

Lou, et al., "Purely gain-coupled distributed feedback semiconductor lasers," Appl. Phys. Lett., vol. 56, No. 17, pp. 1620-1622, Apr. 1990.

\* cited by examiner

COMPLEX-COUPLED DISTRIBUTED FEEDBACK SEMICONDUCTOR LASER

FIELD OF THE INVENTION

This invention relates to semiconductor lasers, and in particular, to complex-coupled distributed feedback (DFB) lasers, comprising an active multi-quantum-well grating, providing a complex-coupling coefficient which is independent of grating etching depth, and asymmetric output powers from anti-reflection (AR) coated laser facets, which can completely eliminate the random effect of grating phase at laser facets.

BACKGROUND OF THE INVENTION

Fiber optic communication systems require high performance light source capable of generating single-mode, narrow spectral linewidth emission in the 1.3-1.56 µm wavelength range. Some of the existing semiconductor lasers, for example, InGaAsP DFB lasers can meet requirements for the light sources for optical communication systems, but fail to satisfy requirements for stable single-mode operation which is insensitive to ambient temperature change (uncooled operation) and insensitive to external optical feedback (isolator-less operation), as well as meeting the requirements of high single-mode yield and high output power.

Conventional index-coupled DFB lasers employing an index corrugation have an inherent problem in existence of two longitudinal modes with an equal threshold gain which results in poor single mode operation as shown in the article by Kogelnik and C. V. Shank, "Coupled-mode theory of distributed feedback lasers", Journal of Applied Physics, vol. 43, no. 5, pp. 2327-2335, May 1972. One known approach to solve this problem is the use of asymmetric facet coating to each facet of the laser. The yield, however, is relatively low due to the random variations of facet grating phase introduced by cleaving.

Another approach is the incorporation of a quarter-wave phase shift, described, for example, in the article by K. Utaka, S. Akiba, K. Sakai, and Y. Matushima, "λ/4-shifted InGaAsP/InP DFB lasers", IEEE Journal of Quantum Electronics, vol. QE-22, no.7, pp. 1042-1052, July 1986. Although this type of DFB laser with perfect AR coatings has, in principle, 100% yield, the yield deterioration due to reflectivities of a few percent is rapid. Furthermore, the output power from the front facet is relatively low due to a symmetric nature in which the same amount of power is emitted and wasted from the back facet. More specifically, so called spatial hole-burning, the reduction of carrier density caused by a too high photon density in the center of a laser cavity deteriorates the side-mode suppression and output power at high injection current levels.

An alternative approach to the mode degeneracy problem is the introduction of gain coupling. It was predicted by H. Kogelnik and C. V. Shank (see the reference cited) that the pure gain coupling provides a single-mode oscillation exactly at the Bragg wavelength. It was also predicted that an addition of even small gain coupling to index coupling (this case is called as "complex coupling") can break the mode degeneracy, as shown in the article by E. Kapon, A. Hardy, and A. Katzir, "The effect of complex coupling coefficients on distributed feedback lasers", IEEE Journal of Quantum Electronics, vol. QE-18, pp. 66-71, January 1982. The pure gain-coupled DFB laser has been demonstrated, for example, in the publication by Y. Luo, Y. Nakano, K. Tada et al., "Purely gain-coupled distributed feedback semiconductor lasers", Appl. Phys. Lett., vol. 56, no. 17, pp. 1620-1622, April 1990.

It has been demonstrated that complex-coupled DFB lasers have many advantages over conventional index-coupled DFB lasers, such as high single-mode yield, less sensitivity to external optical feedback, high modulation bandwidth and reduced wavelength chirp. Among other complex-coupled DFB lasers, multi-quantum-well (MQW) DFB lasers with etched quantum wells appear to provide the highest single-mode stability up to date. For example, G. P. Li, T. Makino et al. "1.55 µm index/gain coupled DFB lasers with strained layer multiquantum-well active grating", Electronics Letters, vol. 28, no. 18, pp. 1726-1727, August 1992, describes a complex-coupled DFB laser, having MQW active grating. The grating is patterned by etching grooves through substantially all MQW layers of the active region and regrowing InP material in the etched grooves. The high corrugation section with a larger number of quantum wells (QW's) has a larger modal gain as well as a lager real modal-index than the low corrugation section in the groove (this is called 'in-phase" complex coupling since index coupling and gain coupling are in phase).

Both theory and experiment have confirmed that in-phase complex-coupled DFB lasers will predominantly lase on the longer wavelength side of the Bragg stop band (this lasing mode is referred to as the long Bragg mode hereafter). This can be explained by standing-wave effect: The standing wave of the long Bragg mode is mostly confined in the high corrugation section, while the standing wave of the mode at the shorter wavelength side of the Bragg stop band (this lasing mode is referred to as the short Bragg mode hereafter) is mostly confined in the low corrugation section, due to the difference of the real modal index in the two sections. Therefore, the long Bragg mode has lower threshold gain than the short Bragg mode. The mode selection is based on the standing-wave effect, not on the phase-shift effect, which results in higher single-mode yield as well as higher single-mode stability, compared to λ/4-shifted DFB lasers.

However, this type of laser has relatively low external quantum efficiency due to too large index coupling induced by periodically etched QW's, losses in the groove regions where there is little gain medium. To improve high power performance, a complex-coupled DFB laser which is similar to that described above but has several QW's not etched in the groove regions, was demonstrated in the article by H. Lu, C. Blaauw, B. Benyon, G. P. Li, and T. Makino, "High-power and high-speed performance of 1.3 µm strained MQW gain-coupled DFB lasers", IEEE Journal of Selected Topics in Quantum Electronics, vol. 1, no. 2, pp. 375-381, June 1995. This type of DFB laser exhibits higher external quantum efficiency because the low corrugation region has several QW's which can reduce the index coupling as well as reducing the waveguide loss.

In the complex-coupled DFB lasers with periodically etched MQW's, described above, however, there are still fundamental problems such as (1) variations of the complex coupling coefficient due to variations of grating etching depth, and (2) laser performance variations due to random variations of facet grating phase. In the prior arts, the etching to make corrugations is stopped in an InGaAsP barrier layer, and an InP material is regrown in the etched grooves. The InGaAsP barrier layer has a real refractive index larger than that of the regrown material InP. The variation of the groove depth causes the variation of the thickness of the etched barrier layer InGaAsP. This results in a variation in both the modal index and the optical confinement factor of the etched groove region, which in turn a variation in the complex (index and gain) coupling coefficient. In the prior arts, in order to get a higher output power from the laser front facet, the combination of one facet AR coated and the other facet cleaved or high reflection (HR) coated are used. The reflection at the cleaved or HR coated facet causes a random variation in the facet grating phase. It was shown that even strong gain coupling cannot eliminate the variation of laser performance due to random grating phase at cleaved facet or HR coated facet, in the article by J. Hong, K. Leong, T. Makino, X. Li, and W. P. Huang, "Impact of random facet phase on modal properties of partly gain-coupled DFB lasers", Journal of Selected Topics in Quantum Electronics, vol. 3, no. 2, pp. 555-568. April 1997.

SUMMARY OF THE INVENTION

It is an object of the present invention to provide a complex-coupled DFB laser comprising an active QW grating, which complex-coupling coefficient is not affected by the variation of grating etching depth, and which has asymmetric laser output powers from AR coated laser facets with eliminating the effect of random facet grating phase.

Thus, according to one aspect of the present invention, there is provided a complex-coupled DFB laser device, comprising:

a) a semiconductor substrate;
b) a laser cavity formed on the semiconductor substrate;
c) an active region formed on the semiconductor substrate, comprising multiple quantum-well layers adjoined with barrier layers;
d) a complex-coupled grating having corrugations along the optical axis formed by periodically etching grooves through QW layer structures, wherein the barrier layer in which the groove etching is to be stopped, the regrown layer in the etched grooves, and the cladding region, being made of the same semiconductor material;
e) contact means facilitating flowing an electrical current through the semiconductor device for pumping the active region.

Thus, a DFB semiconductor laser device is provided, which has an active grating entirely buried in the same material. This may produce a complex-coupling coefficient which becomes independent of grating etching depth since the refractive indices of the two materials below and above the groove edge are the same. The compositions of all the QW's are tailored to provide almost same gain peak wavelengths by choosing proper compositions and QW layer thickness so that a sufficient modal gain for lasing is produced.

According to another aspect of the present invention, there is provided a complex-coupled distributed feedback (DFB) laser device, comprising a semiconductor layer structure described as in the first embodiment, the laser cavity being composed of two cavity sections having different Bragg wavelengths. The portion of the laser cavity that is adjacent to the front facet of the cavity is referred to as the "front" cavity section, and the remaining portion of the cavity is referred to as the "back" cavity section. The front and back facets are AR coated, eliminating the random effect of facet grating phase.

The length of the front cavity section is selected substantially longer than that of the back cavity section so that the lasing mode is mainly determined by the front cavity section. The main mode is obtained at the longer wavelength side of the Bragg stop band of the front cavity section (which Bragg wavelength is denoted by $\lambda_{Bf}$) due to in-phase complex coupling: The lasing wavelength $\lambda_L$ is given approximately by $\lambda_{Bf}+\Delta\lambda_{Bf}/2$ where $\Delta\lambda_{Bf}$ is the width of the Bragg stop band of the front cavity section. The Bragg wavelength of the back cavity section (which is denoted by $\lambda_{Bb}$) is chosen larger than $\lambda_{Bf}$. By choosing $\lambda_{Bb}$ very close to $\lambda_{Bf}+\Delta\lambda_{Bf}/2$, which is, therefore, very close to lasing wavelength $\lambda_L$, the back cavity section is made to act mainly as a reflector for the lasing wavelength: This may produce an asymmetric power distribution in the laser cavity, the front facet power higher than the back facet power.

BRIEF DESCRIPTION OF THE DRAWINGS

The invention will now be described in greater detail having regard to the appended drawings in which.

DESCRIPTION OF THE PREFERRED EMBODIMENTS

Structure and Operation

Figure 1:
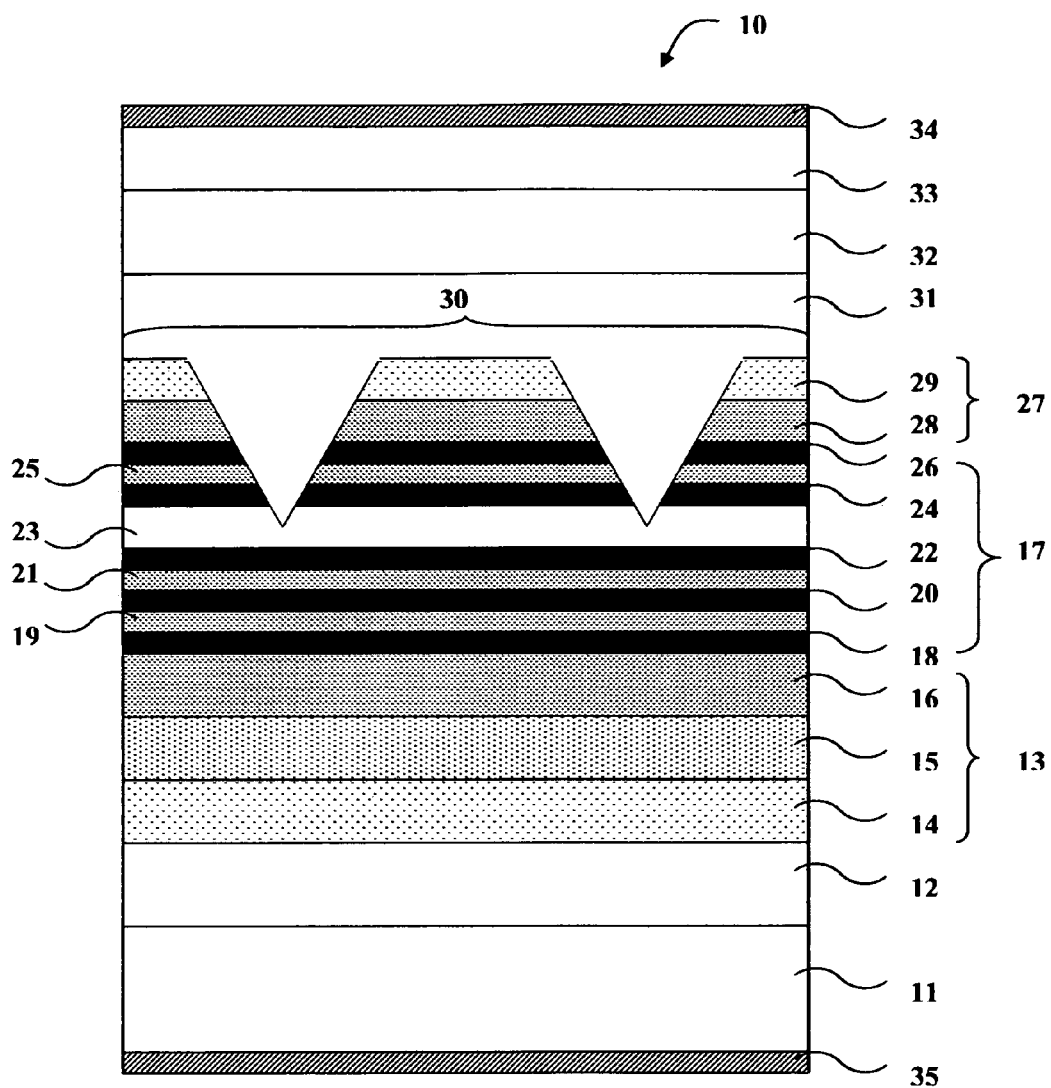
FIG. 1 is a cross-sectional view of a complex-coupled DFB laser according to a first embodiment of the invention.

A schematic cross section through a complex-coupled DFB laser device 10 according to a first embodiment of the present invention is shown in FIG. 1. The DFB laser structure is composed of an active region with periodic variation of thickness, which is made by etching through a part of the active region, and composed of upper and lower cladding layers. The device includes an N-type InP substrate 11 on which is grown a 1.5 µm thick buffer layer 12 of N-type InP. A first separate confinement region 13, consisting of three confinement layers 14, 15, and 16, of N-type InGaAsP with bandgap energies corresponding to wavelengths of 1.0 µm, 1.05 µm, and 1.1 µm, respectively, is provided over the buffer layer 12. The thickness of each confinement layer is 20 nm. An active region 17 overlies the confinement region 13 and comprises five QW layers 18, 20, 22, 24, and 26, and four barrier layers 19, 21, 23, and 25. The barrier layers 19, 21, and 25 are made of InGaAsP composition with a band gap energy corresponding to wavelength of 1.1 µm, each being 10 nm thick. The QW layers 18, 20, and 26, are made of InGaAsP composition, and are tailored so as to provide a first transition energy of the QW, corresponding to wavelength of 1.31 µm: The QW transition energy is determined by a combination of the QW alloy composition (having a PL peak wavelength of around 1.3 µm), strain (preferably compressive strain of 1%), thickness (preferably 6~7 nm), and the band gap energy of their adjacent barrier layers (having a corresponding wavelength of 1.1 µm). The barrier layer 23 is made of InP, the layer being 10~20 nm thick. The QW layers 22 and 24 are made of InGaAsP composition, and tailored so as to provide a first transition energy of the QW, corresponding to wavelength 1.31 µm, using the principle as described above. A second confinement region 27, consisting of two confinement layers 28 and 29, of InGaAsP with bandgap energies corresponding to wavelengths of 1.1 µm, and 1.0 µm, respectively, is provided on top of the active region 17, each layer thickness being 20 nm. A grating 30 is defined by periodically etched grooves through the QW layers 24 and 26. The groove etching is stopped in the barrier layer 23. The pitch of the grooves of the grating is selected so as to define a first-order grating for the Bragg wavelength. A P-type InP material 31 is grown to fill the grooves of the grating and to make a layer of 0.2 µm thickness on top of the confinement layer 29. An upper cladding layer of P-type InP of 1.3~1.6 µm thickness, followed by a highly doped P-type capping layer 33 of InGaAs for contact enhancement, having thickness 200 nm, completes the structure. Top electrode 34 and bottom electrode 35 are formed for current injection into the laser device 10.

Principles of operation, demonstrated on a complex-coupled DFB laser according to the first embodiment of the invention, are as follows. The wavelength corresponding to a transition between the first quantized levels of conduction and valance bands of a QW with symmetric barriers is given by (as is shown in the article by T. Makino, "Analytical formulas for the optical gain of quantum wells", IEEE Journal of Quantum Electronics, vol. 32, no. 3, pp. 493-501, 1996)

$$\lambda(\mu m) = \frac{1.24}{E_g + E_c + E_v} \quad (1)$$

where $E_g$ is the energy band gap energy of the QW (in unit eV), and $E_c$ and $E_v$ are the quantized energy levels in the conduction and valence bands, respectively (in unit eV). $E_c$ can be approximated as $$E_c = \left[\frac{\pi}{2} \frac{a_c}{W + \Delta W_c}\right]^2 \quad (2)$$

where $$\Delta W_c = \frac{a_c}{\sqrt{b_c \Delta E_c}} \quad (3)$$

$$a_c = \frac{2\hbar}{\sqrt{2m_{cw}}}, \quad (4)$$

$$b_c = \frac{m_{cw}}{m_{cb}}$$

$\Delta E_c$ is the discontinuity of the band edge of the conduction band, h is Planck's constant divided by $2\pi$, W is the QW width, and $m_{cw}$ and $m_{cb}$ are the effective masses of electrons inside the well, and the barrier, respectively. $E_v$ for the valance band can be expressed by equation (2) with replacing subscript "c" by a subscript "v". It can be seen from equation (2) that the larger $\Delta E_c$ ($\Delta E_v$) gives larger $E_c$ ($E_v$), which in turn gives shorter first transition wavelength $\lambda$ in equation (1). It means that the barrier having larger band gap energy has a shorter first transition wavelength for a given QW.

In FIG. 1, for the QW layers 18, 20, 26, we use, for example, a lattice matched quaternary (Q) InGaAsP QW of bandgap energy of 0.886 eV (its corresponding wavelength 1.4 µm, and, therefore, this InGaAsP is referred to as 1.4 Q), and QW thickness 65 nm. In this example, the first transition wavelength is calculated to be 1.313 µm (in this case, the QW layers have symmetric 1.1 Q barriers). The other two QW's 22 and 24 have asymmetric barriers composing of 1.1 Q and InP (band gap energy of 1.35 eV). This asymmetric QW structure cannot be analyzed by equation (2). The first transition wavelength of this structure is calculated numerically to be 1.300 µm. For comparison, the first transition wavelength of the symmetric QW structure with symmetric InP is calculated by equation (2) to be 1.279 µm. Therefore, the first transition wavelength (1.300 µm) of the asymmetric QW structure with 1.1 Q and InP barriers is between those of the symmetric QW structures with 1.1 Q and InP barriers (1.313 µm and 1.279 µm, respectively). This confirms that the first transition wavelength of a QW is made shorter by using a barrier of larger band gap energy. In order to have a sufficient modal gain for lasing, the symmetric and asymmetric quantum-well structures need to provide the same gain peak wavelength. The first transition wavelength of the two asymmetric QW's can be increased from 1.300 µm to 1.313 µm by increasing the QW thickness slightly. In this way, the two types of quantum-well structures are tailored to provide almost same gain peak wavelengths.

Figure 2:
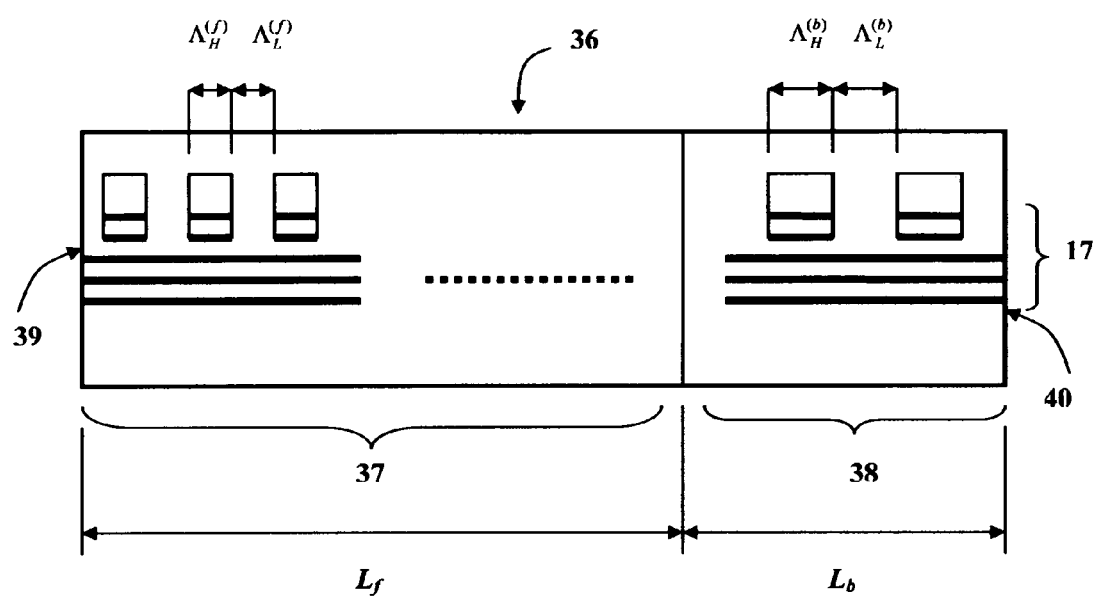
FIG. 2 is a cross-sectional view of a complex-coupled DFB laser with two cavity sections comprising two different grating pitches, according to a second embodiment of the invention.

A schematic cross section through a complex-coupled DFB laser device 36 according to a second embodiment of the present invention is shown in FIG. 2. In FIG. 2, the laser structure is same as the one shown in FIG. 1, although the detailed layer structure is not shown, and the rectangular shape grating is used instead of trapezoidal shape grating (which is used in FIG. 1), just for the sake of simplicity.

The laser cavity comprises two sections 37 and 38, comprising complex-coupled gratings which have different Bragg wavelengths; A front section 37 of the two cavity sections, having a length of $L_f$ and a Bragg wavelength of $\lambda_{Bf}$, and a back section 38, having a length of $L_b$ and a Bragg wavelength of $\lambda_{Bb}$, wherein $\lambda_{Bb} > \lambda_{Bf}$ and $L_f > L_b$. Both front facet 39 and back facet 40 are AR coated, eliminating facet reflections. The lengths of the two cavity sections are selected such that lasing feedback is mainly provided by the front cavity section: The lasing mode is obtained at the longer wavelength side of the Bragg stop band of the first cavity section due to in-phase complex coupling.

Figure 3:
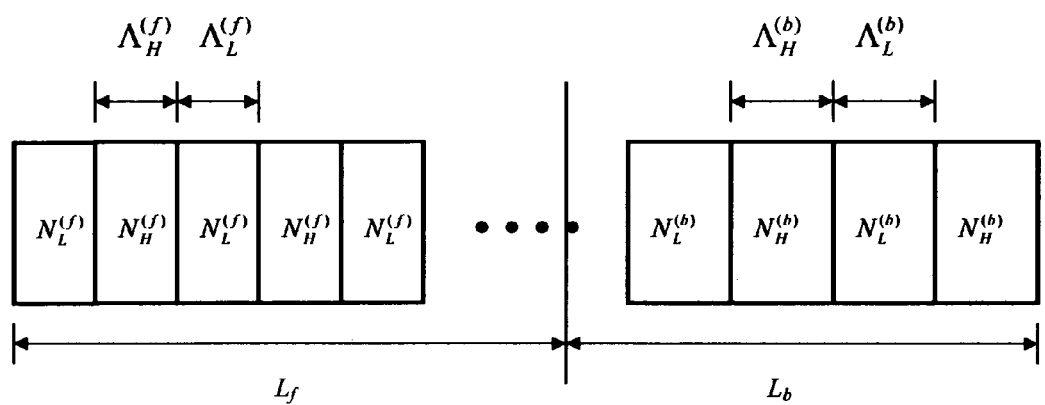
FIG. 3 is a transformed one-dimensional model of the laser structure of FIG. 2.

The operational principle is explained in the followings. As shown in the article by T. Makino, "Effective-index matrix analysis of distributed feedback semiconductor lasers", IEEE Journal of Quantum Electronics, vol. 28, no. 2, pp. 434-44-, February 1992, the DFB laser structure in FIG. 2 can be transformed to a one-dimensional stacked-layer structure, as shown in FIG. 3. The structure consists of alternating layers with complex indices $N_H$ and $N_L$ which correspond to the active grating region with a larger number of QW's (designated as H region) and the active grating region with a smaller number of QW's (designated as L region), respectively. The complex index $N_H$ or $N_L$ can be expressed as, $$N_s = n_s + jm_s \quad (5)$$

where $n_s$ and $m_s$ are the real part and imaginary part of the complex index for the section s (s=H or L), and $m_s$ can be expressed as $$m_s = [\Gamma_s g_s - (1-\Gamma_s)\alpha_s]/(2k) \quad (6)$$

where $\Gamma_s$ is the optical confinement factor for the active QW, $g_s$ is the material gain in the QW, $\alpha_s$ is the absorption loss in the other layer, and k is the vacuum wavenumber. $n_H$ is larger than $n_L$ since the region H has more quaternary materials which have a higher refractive index. This provides index coupling. $\Gamma_H$ is larger than $\Gamma_L$ because the region H has a larger number of QWs ($\Gamma_s$ is roughly proportional to the number of QWs). Usually $\alpha_s$ in (6) is much smaller than $g_s$, giving $m_H > m_L$. This provides gain coupling. There are two dominant modes at both edges of the Bragg stop band (the long Bragg mode and the short Bragg mode) for index-coupled DFB lasers with no facet reflections. The field of the long Bragg mode is mainly confined in the H region, while the field of the short Bragg mode is mainly confined in the L region, as shown in the article by J. Hamasaki and T. Iwashima, "A single-wavelength DFB structure with a synchronized gain profile", IEEE Journal of Quantum Electronics, vol. QE-24, pp. 1864-1872, September 1988. If the high index region has a higher gain ($m_H > m_L$ in equation (6)) (in-phase complex coupling), the long Bragg mode experiences a higher gain than the short Bragg mode. Therefore, the long Bragg mode becomes the main mode, and the short Bragg mode is suppressed. On the contrary, if the high index region has a lower gain (anti-phase complex coupling), the short Bragg mode becomes the main mode. In the embodiment of the invention, the region H has higher $n_H$ and $n_L$. Therefore, the structure has in-phase complex coupling.

Referring to FIG. 3, the Bragg wavelengths of the front (left) and back (right) sections $\lambda_{Bf}$ and $\lambda_{Bf}$ are given by $$\lambda_{Bf} = 4n_H^{(f)}\Lambda_H^{(f)} = 4n_L^{(f)}\Lambda_L^{(f)}, \quad \lambda_{Bb} = 4n_H^{(b)}\Lambda_H^{(b)} = 4n_L^{(b)}\Lambda_L^{(b)} \quad (7)$$

$\Lambda_H^{(f)}$ and $\Lambda_L^{(f)}$ are the lengths of the H and L regions, respectively, in the front section, and $n_H^{(f)}$ and $n_L^{(f)}$ are the real refractive indices in the corresponding regions. $\Lambda_H^{(b)}$ and $\Lambda_L^{(b)}$ are the lengths of the H and L regions, respectively, in the back section, respectively, and $n_H^{(b)}$ and $n_L^{(b)}$ are the real refractive indices in the corresponding regions.

Figure 4:
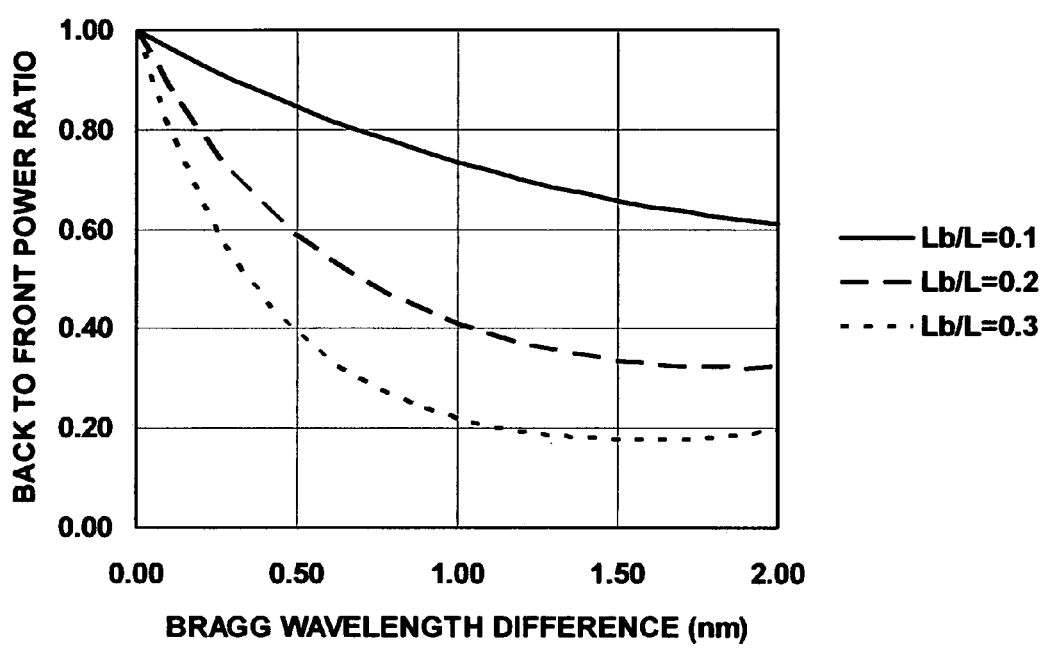
FIG. 4 is a calculated ratio of the two facet powers as a function of the Bragg wavelength difference between the two cavity sections with taking the ratio of the two cavity section lengths as a parameter.
Figure 5:
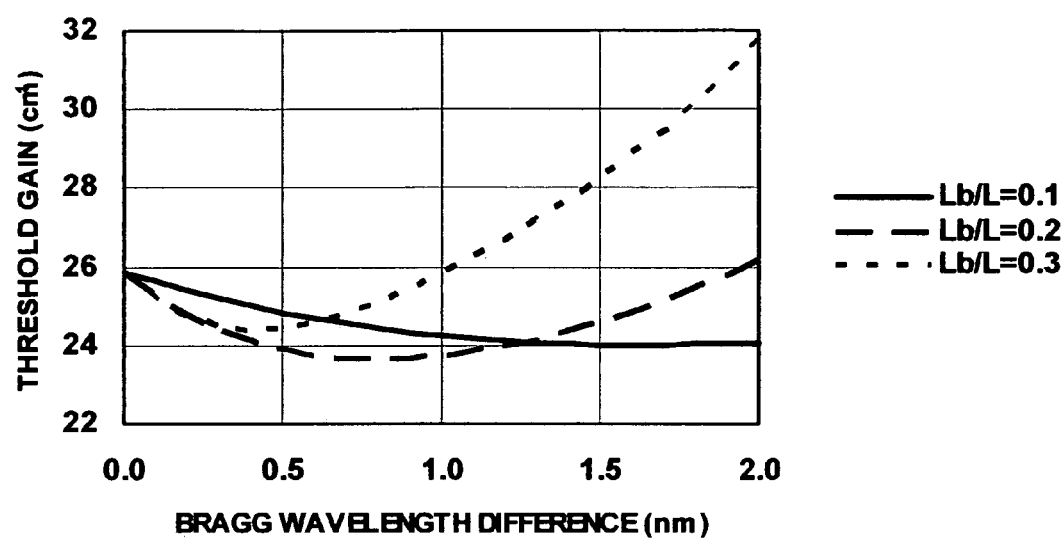
FIG. 5 is a calculated threshold gain of the main mode as a function of the Bragg wavelength difference between the two cavity sections with taking the ratio of the two cavity section lengths as a parameter.
Figure 6:
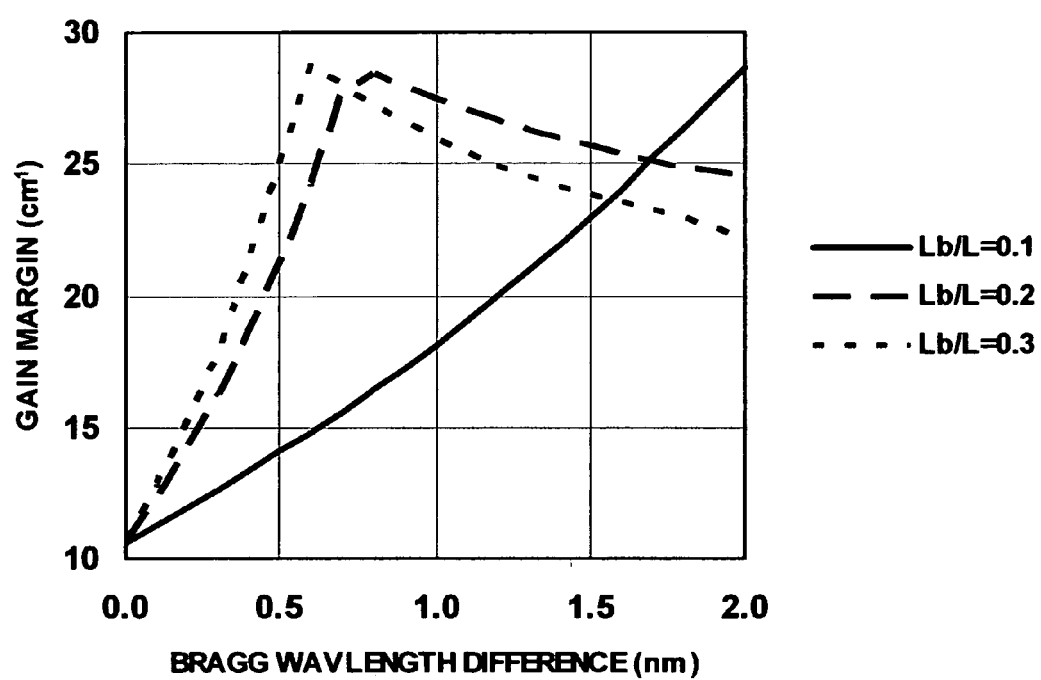
FIG. 6 is a calculated gain margin (threshold gain difference between the two lowest lasing modes) as a function of the Bragg wavelength difference with taking the ratio of the two cavity section lengths as a parameter.

The laser performance can be analyzed by the transfer matrix method, as shown in the article by T. Makino, cited above. Since the main mode is determined mainly by the front section (which is chosen to be 70~80% of the total cavity length), the mode wavelength is located at the longer wavelength side of the Bragg stop band of the front section. FIG. 4 shows a calculated ratio of the power $P_b$ emitted from the back facet and the power $P_f$ emitted from the front facet as a function of the difference of the two Bragg wavelengths $\lambda_{Bb} - \lambda_{Bf}$ with cavity length ratio $L_b/L$ (L is the total cavity length) as a parameter. In this calculation, rectangular shape corrugations are assumed for the sake of simplicity, and $n_H = 3.21$, $n_L = 3.20$, $\Gamma_H = 0.06$, and $\Gamma_L = 0.03$ are used, which roughly represent a structure in FIG. 1. It can be seen that the power ratio $P_b/P_f$ decreases significantly as $\lambda_{Bb} - \lambda_{Bf}$ increases. Therefore, the external efficiency (output power at a certain injection current) for the front facet will be increased if the threshold gain does not change significantly. In FIG. 5, a similar plot is shown for the threshold gain of the main mode. The threshold gain even decreases as $\lambda_{Bb} - \lambda_{Bf}$ increases, if $L_b/L$ is relatively small. Therefore, if $\lambda_{Bb} - \lambda_{Bf}$ is chosen to be 1~2 nm, the external efficiency (output power at a certain injection current) from the front facet will be increased. FIG. 6 shows a calculated gain margin (threshold gain difference between the two lowest modes) as a function of the Bragg wavelength difference. The lasing mode is always obtained at the longer wavelength side of the Bragg stop band of the first cavity section due to in-phase complex coupling. The lasing wavelength is given approximately by $\lambda_{Bf} + \Delta\lambda_{Bf}/2$ where $\Delta\lambda_{Bf}$ is the width of the Bragg stop band of the front cavity section. Therefore, if $\lambda_{Bb}$ is chosen such that $\lambda_{Bb} \approx \lambda_{Bf} + \Delta\lambda_{Bf}/2$, the lasing wavelength is made to match $\lambda_{Bb}$ at which the back cavity section has a maximum reflection. In this way, an asymmetric power distribution in the laser cavity is produced, making the front facet power higher than the back facet power.

Figure 7:
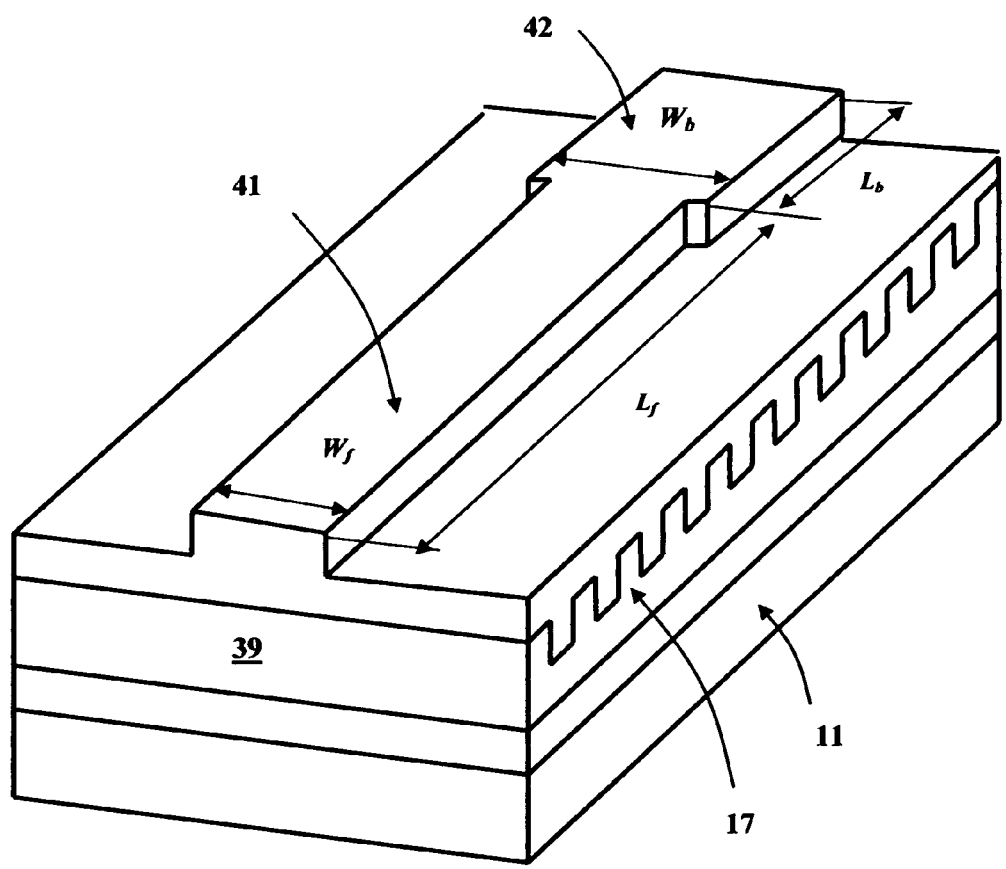
FIG. 7 is a perspective view of a ridge waveguide complex-coupled DFB laser, comprising two different ridge widths, according to a third embodiment of the present invention.

FIG. 7 is a perspective view to show the construction of a third embodiment of a complex-coupled DFB laser according to the present invention. The laser cavity consists of a uniform grating in stead of two gratings with different periods. The two sections have different ridge widths: The front ridge section 41 (length $L_f$) has a smaller ridge width of $W_f$ and the back ridge section 42 (length $L_b$) has a larger ridge width of $W_b$. It has been shown that the effective index increases with increasing ridge width, as described in the article by A. Sarangan, W. P. Huang, T. Makino, and G. P. Li, "Dynamic single-transverse-mode properties of varying ridge width DFB laser arrays", IEEE Photonics Technology Letters, vol. 8, no. 10, 1305-1307, October 1996. Therefore, if we choose $W_b > W_f$, we obtain $n_H^{(b)} > n_H^{(f)}$ and $n_L^{(b)} > n_L^{(f)}$. Then, we have $\lambda_{Bb} > \lambda_{Bf}$ from equation (7), noting that $\Lambda_H^{(f)} = \Lambda_H^{(b)}$ and $\Lambda_L^{(b)} = \Lambda_L^{(b)}$ in this case. This means that changing the ridge width is equivalent to changing the grating pitch. Therefore, the same effect as that in the second embodiment is expected. For example, the amount $\lambda_{Bb} - \lambda_{Bf}$ of 1~2 nm can be achieved by using ridge widths $W_f = 2$ μm and $W_b = 3$~4 μm. The third embodiment has a significant advantage in that the fabrication is relatively simple: A uniform grating can be used with a stripe mask with two segments of different ridge widths for the etching process to make a ridge waveguide.

Figure 8:
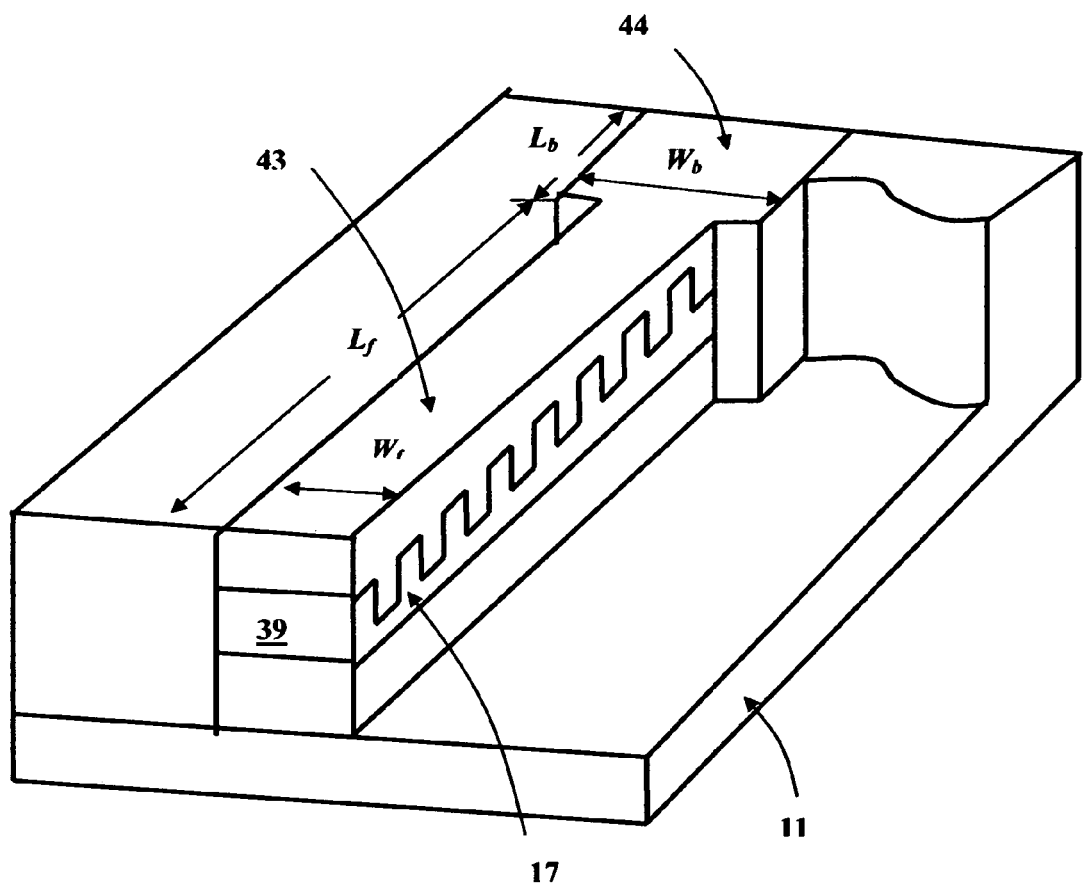
FIG. 8 is a perspective view of a buried hetero (BH) complex-coupled DFB laser, comprising two different BH mesa widths, according to a fourth embodiment of the present invention.

FIG. 8 is a perspective view to show the construction of a fourth embodiment of a complex-coupled DFB laser according to the present invention. The laser cavity consists of a uniform grating and two different buried hetero (BH) mesa widths. The front BH mesa section 43 (length $L_f$) has a smaller width of $W_f$ and the back BH mesa section 44 (length $L_b$) has a larger width of $W_b$.

It has been shown that the effective index increases with increasing the BH mesa width, in the article by M. Möhrle, A. Sigmund, R. Steingrüber, W. Fürst, and A. Suna, "All active tapered 1.55-μm InGaAsP BH-DFB laser with continuously chirped grating", IEEE Photon. Technol. Letters, vol. 15, no. 3, pp. 365-367, March 2003. Similarly to the third embodiment, the Bragg wavelength of the back cavity section can be made larger than that of the front cavity section. Therefore, the same effect as that in the third embodiment is expected.

While certain specific embodiments of the invention have been described, it will be apparent to one skilled in the art that other alternatives or variations are possible. It is to be understood, however, that such alternatives or variations will fall within the scope of the invention as described in the applied claims.

What is claimed is:

1. A complex-coupled distributed feedback (DFB) semiconductor laser device comprising:
    a) a semiconductor substrate;
    b) a radiation cavity formed on the semiconductor substrate;
    c) an active region formed in the radiation cavity, comprising (1) a plurality of quantum-well layers of bandgap energy $E_{q1}$, adjoined with symmetric barrier layers of bandgap energy $E_{b1}$ wherein $E_{b1} > E_{q1}$, and (2) two quantum-well layers of bandgap energy $E_{q2}$, adjoined with a barrier layer of bandgap energy $E_{b2}$ in between the two quantum-well layers, and adjoined with two outside barrier layers of bandgap energy $E_{b1}$ wherein $E_{b2} > E_{b1} > E_{q1} \geqq E_{q2}$;

d) a complex-coupled grating having corrugations along the optical axis formed by periodically etching grooves through the active region, the groove etching being stopped in the barrier layer of bandgap energy $E_{b2}$, and the grating period comprising a high corrugation section and a low corrugation section, wherein a plurality of the quantum-well layers are etched away from the low corrugation section, wherein the radiation cavity comprises two sections: a front cavity section of length $L_f$ in which the complex-coupled grating has Bragg wavelength $\lambda_{Bf}$, and a back cavity section of length $L_b$ in which the complex-coupled grating has Bragg wavelength $\lambda_{Bb}$ which is larger than $\lambda_{Bf}$, lasing feedback being provided mainly by the front cavity section to give a main lasing mode at the longer wavelength side of the Bragg stop band of the complex-coupled grating in the front cavity section, and wherein the front and back cavity sections have the following lengths $L_f$ and $L_b$, and Bragg wavelengths $\lambda_{Bf}$ and $\lambda_{Bb}$: $0.1 < L_b/(L_f + L_b) < 0.3$ and $0 < \lambda_{Bb} - \lambda_{Bf} < 3$ nm;

e) a semiconductor layer regrown in the etched grooves, having bandgap energy $E_{b2}$; and f) contact means facilitating flowing an electrical current through the semiconductor laser device.

2. A laser device as defined in claim 1, wherein the grating is a first-order grating.

3. A laser device as defined in claim 1, wherein a current confining region is formed on the active region.

4. A laser device as defined in claim 3, wherein the current confining region is a ridge waveguide structure.

5. A laser device as defined in claim 3, wherein the current confining region is a buried hetero (BH) waveguide structure.

6. A laser device as defined in claim 1, wherein the semiconductor substrate is N-type InP.

7. A laser device as defined in claim 1, wherein the semiconductor substrate is P-type InP.

8. A laser device as defined in claim 1, the quantum-well layer of bandgap energy $E_{q1}$ is InGaAsP.

9. A laser device as defined in claim 8, wherein the active region is capable of generating light in the wavelength range of 1.3-1.56 μm.

10. A laser device as defined in claim 1, the quantum-well layer of bandgap energy $E_{q2}$ is InGaAsP.

11. A laser device as defined in claim 10, wherein the active region is capable of generating light in the wavelength range of 1.3-1.56 μm.

12. A laser device as defined in claim 1, the barrier layer of bandgap energy $E_{b1}$ is InGaAsP.

13. A laser device as defined in claim 1, the barrier layer of bandgap energy $E_{b2}$ is InP.

14. A laser device as defined in claim 1, comprising a ridge waveguide structure; wherein the ridge width of the back cavity section is larger than the ridge width of the front cavity section.

15. A laser device as defined in claim 1, comprising a buried hetero (BH) waveguide structure; wherein the BH mesa width of the back cavity section is larger than the BH mesa width of the font cavity section.

* * * * *